United States Patent
Kong et al.

(10) Patent No.: US 9,553,573 B2
(45) Date of Patent: Jan. 24, 2017

(54) DIFFERENTIAL MODE BANDWIDTH EXTENSION TECHNIQUE WITH COMMON MODE COMPENSATION

(71) Applicant: QUALCOMM Incorporated, San Diego, CA (US)

(72) Inventors: Derui Kong, San Diego, CA (US); Sang Min Lee, San Diego, CA (US); Michael Joseph McGowan, Mesa, AZ (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 54 days.

(21) Appl. No.: 14/487,654

(22) Filed: Sep. 16, 2014

(65) Prior Publication Data

US 2015/0341025 A1 Nov. 26, 2015

Related U.S. Application Data

(60) Provisional application No. 62/001,574, filed on May 21, 2014.

(51) Int. Cl.
*H03K 17/16* (2006.01)
*H03K 17/30* (2006.01)
*H03F 1/14* (2006.01)
*H03F 3/45* (2006.01)

(52) U.S. Cl.
CPC .............. *H03K 17/16* (2013.01); *H03F 1/14* (2013.01); *H03F 3/45188* (2013.01)

(58) Field of Classification Search
CPC .............. H03K 17/16; H03K 17/161–17/168

USPC .................................................. 327/382–389
See application file for complete search history.

(56) References Cited

U.S. PATENT DOCUMENTS

| | | |
|---|---|---|
| 6,972,624 B1 | 12/2005 | Stroet |
| 6,985,036 B2 | 1/2006 | Bhattacharjee et al. |
| 7,501,907 B1 | 3/2009 | Teo |
| 7,612,609 B1 | 11/2009 | Megaw |
| 7,633,341 B2 | 12/2009 | Bagheri et al. |

(Continued)

FOREIGN PATENT DOCUMENTS

EP         0652635 A1    5/1995

OTHER PUBLICATIONS

Galal S., et al., "10-Gb/s limiting amplifier and laser modulator driver in 0.18-/spl mu/m CMOS technology," IEEE Journal of Solid-State Circuits, IEEE Service Center, Piscataway, NJ, USA, vol. 38, No. 12, Dec. 1, 2003, pp. 2138-2146, XP011104262, ISSN: 0018-9200, DOI:10.1109/JSSC.2003.818567.

(Continued)

*Primary Examiner* — Lincoln Donovan
*Assistant Examiner* — Metasebia Retebo
(74) *Attorney, Agent, or Firm* — Arent Fox LLP

(57) ABSTRACT

A method and apparatus are provided. The apparatus may be a capacitive element for adjusting a net capacitance of a circuit. The apparatus may be configured to be coupled to the circuit. The apparatus may be configured to adjust the net capacitance of the circuit to decouple common mode and differential loop bandwidth adjustment of the circuit. The capacitive element may include a pair of cross-coupled capacitors configured to be coupled to differential nodes of the circuit, and a pair of negative gain buffers coupled to respective capacitors.

22 Claims, 9 Drawing Sheets

(56) References Cited

U.S. PATENT DOCUMENTS

| | | | |
|---|---|---|---|
| 7,697,915 B2 | 4/2010 | Behzad et al. | |
| 8,098,101 B2 | 1/2012 | Savla et al. | |
| 2009/0066431 A1* | 3/2009 | Shin | H03B 5/1852 331/117 FE |
| 2012/0139631 A1* | 6/2012 | Wong | H03F 3/45188 330/253 |
| 2012/0286860 A1 | 11/2012 | Park et al. | |
| 2013/0033321 A1* | 2/2013 | Lindstrand | H03F 1/523 330/253 |

OTHER PUBLICATIONS

International Search Report and Written Opinion—PCT/US2015/029756—ISA/EPO—Sep. 18, 2015.

Comer D.J., et al., "Bandwidth Extension of High-Gain CMOS Stages Using Active Negative Capacitance," 13th IEEE International Conference on Electronics, Circuits and Systems (ICECS), Dec. 2006, pp. 628-631.

Arai T., et al., "A 2.5 V active lowpass filter using all-npn gain cells with a 1 V pp linear input range", IEEE International Solid-State Circuits Conference, Digest of Technical Papers, 40th ISSCC, Feb. 1993, pp. 112-113, 272.

Kwan T., et al., "An adaptive analog continuous-time CMOS biquadratic filter", IEEE Journal of Solid-State Circuits, DOI-10.1109/4.78275, Jun. 1991, vol. 26, No. 6, pp. 859-867.

Leuciuc A., "A wide linear range low-voltage transconductor", Proceedings of the 2003 International Symposium DnCircuits and Systems, ISCAS '03, May 25-28, 2003, vol. 1, pp. I-161-I-164.

Qualcomm., "Wide-Band Current Steering TXDAC with Calibration for 20nm SOC MSMs, datasheets", Rev. P1.0, May 9, 2013, pp. 1-94.

Willingham S.D., et al., "A BiCMOS low-distortion 8-MHz low-pass filter", IEEE Journal of Solid-State Circuits, Dec. 1993, vol. 28, No. 12, pp. 1234-1245.

* cited by examiner

DIFFERENTIAL MODE BANDWIDTH
EXTENSION TECHNIQUE WITH COMMON
MODE COMPENSATION

CROSS-REFERENCE TO RELATED APPLICATION

This application claims the benefit of U.S. Provisional Application Ser. No. 62/001,574, entitled "DIFFERENTIAL MODE BANDWIDTH EXTENSION TECHNIQUE WITH COMMON MODE COMPENSATION," and filed on May 21, 2014, which is expressly incorporated by reference herein in its entirety.

BACKGROUND

1. Field

The present disclosure relates generally to communication systems, and more particularly, to a differential mode bandwidth extension technique with common mode compensation.

2. Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. Additionally, the transmitter may include a digital-to-analog converter (DAC), which may be coupled to a transconductance ($g_m$) circuit. The DAC may assist in the generation of the output RF signal that is transmitted.

A DAC converts digital signals (e.g., a 4-bit DAC converts a digital word of four bits, such as a digital signal of 0110) into a corresponding current or a corresponding analog voltage. A four-bit DAC will produce a different analog voltage value, or a different amount of current, for each possible digital value. That is, the four-bit DAC will produce a different current or analog voltage for each value of the digital signal from 0000 to 1111.

SUMMARY

In an aspect of the disclosure, a method and an apparatus are provided. The apparatus may be a capacitive element for adjusting a net capacitance of a circuit. The apparatus may be configured to be coupled to the circuit. The apparatus may be configured to adjust the net capacitance of the circuit to decouple common mode and differential loop bandwidth adjustment of the circuit. The capacitive element may include a pair of cross-coupled capacitors configured to be coupled to differential nodes of the circuit, and a pair of negative gain buffers coupled to respective capacitors.

In an aspect of the disclosure, a method and an apparatus are provided. The apparatus may be a capacitive element configured to be coupled to a circuit, and configured to adjust a net capacitance of the circuit to decouple common mode and differential loop bandwidth adjustment of the circuit. The capacitive element may include a pair of cross-coupled transistors, a pair of capacitors, and a pair of diode-connected transistors. Each of the transistors may include a source electrode coupled to ground, a drain electrode, and a gate electrode. The pair of capacitors may include a first electrode coupled to the drain electrode of a respective one of the cross-coupled transistors, and a second electrode coupled to the gate electrode of an opposite respective one of the cross-coupled transistors. The pair of diode-connected transistors may each include a source electrode coupled to the drain electrode of the respective one of the cross-coupled transistors.

In an aspect of the disclosure, a method and an apparatus are provided. The apparatus may amplify a signal. The apparatus may include an operational amplifier, and a capacitive element coupled to the operational amplifier. The capacitive element may be configured to at least partially negate a parasitic capacitance of the operational amplifier in a first mode, and may be configured to provide additional capacitance in a second mode. The capacitive element may include a pair of cross-coupled capacitors configured to be coupled to differential nodes of the circuit, and a pair of negative gain buffers coupled to respective capacitors. The capacitive element may be configured to decouple common mode and differential loop bandwidth adjustment of the operational amplifier.

In an aspect of the disclosure, a method and an apparatus are provided. The apparatus may decouple common mode and differential loop bandwidth adjustment of a circuit. The apparatus may include means for adjusting, with a capacitive element, a net capacitance of the circuit. The capacitive element may include a pair of cross-coupled capacitors configured to be coupled to differential nodes of the circuit, and a pair of negative gain buffers coupled to respective capacitors.

In an aspect of the disclosure, a method and an apparatus are provided. The apparatus may decouple common mode and differential loop bandwidth adjustment of a circuit. The apparatus may include means for adjusting, with a capacitive element, a net capacitance of the circuit. The capacitive element may include a pair of cross-coupled transistors, a pair of capacitors, and a pair of diode-connected transistors. The pair of cross-coupled transistors may each include a source electrode coupled to ground, a drain electrode, and a gate electrode. The pair of capacitors may each include a first electrode coupled to the drain electrode of a respective one of the cross-coupled transistors, and a second electrode coupled to the gate electrode of an opposite respective one of the cross-coupled transistors. The pair of diode-connected transistors may each include a source electrode coupled to the drain electrode of the respective one of the cross-coupled transistors.

In an aspect of the disclosure, a method and an apparatus are provided. The method may include decoupling common mode and differential loop bandwidth adjustment of a circuit. The method may further include increasing, with a capacitive element, a capacitance of the circuit in a common mode. The capacitive element may include a pair of cross-coupled capacitors configured to be coupled to differential nodes of the circuit. The capacitive element may further include a pair of negative gain buffers coupled to respective capacitors.

In an aspect of the disclosure, a method and an apparatus are provided. The method may include adjusting a net capacitance of a circuit with a capacitive element. The capacitive element may include a pair of cross-coupled capacitors configured to be coupled to differential nodes of the circuit. The capacitive element may further include a pair of negative gain buffers coupled to respective capacitors. The method may further include adjusting the net capacitance of the circuit to decouple common mode and differential loop bandwidth adjustment of the circuit.

DETAILED DESCRIPTION

Figure 1:
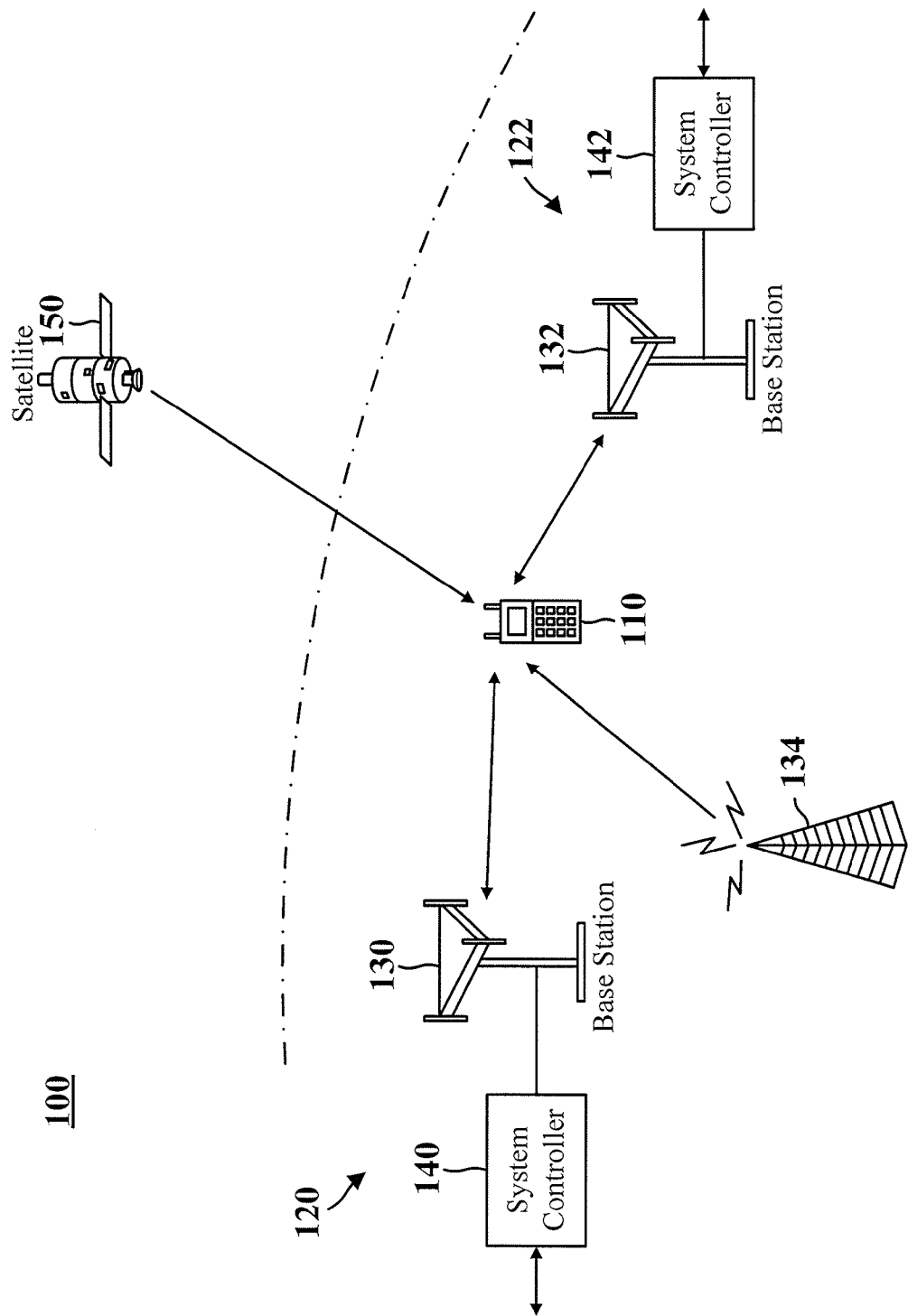
FIG. 1 illustrates a wireless device communicating with different wireless communication systems.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating a wireless device 110 communicating with different wireless communication systems 120, 122. The wireless systems 120, 122 may each be a Code Division Multiple Access (CDMA) system, a Global System for Mobile Communications (GSM) system, an LTE system, a wireless local area network (WLAN) system, or some other wireless system. A CDMA system may implement Wideband CDMA (WCDMA), CDMA 1× or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE.

Figure 2:
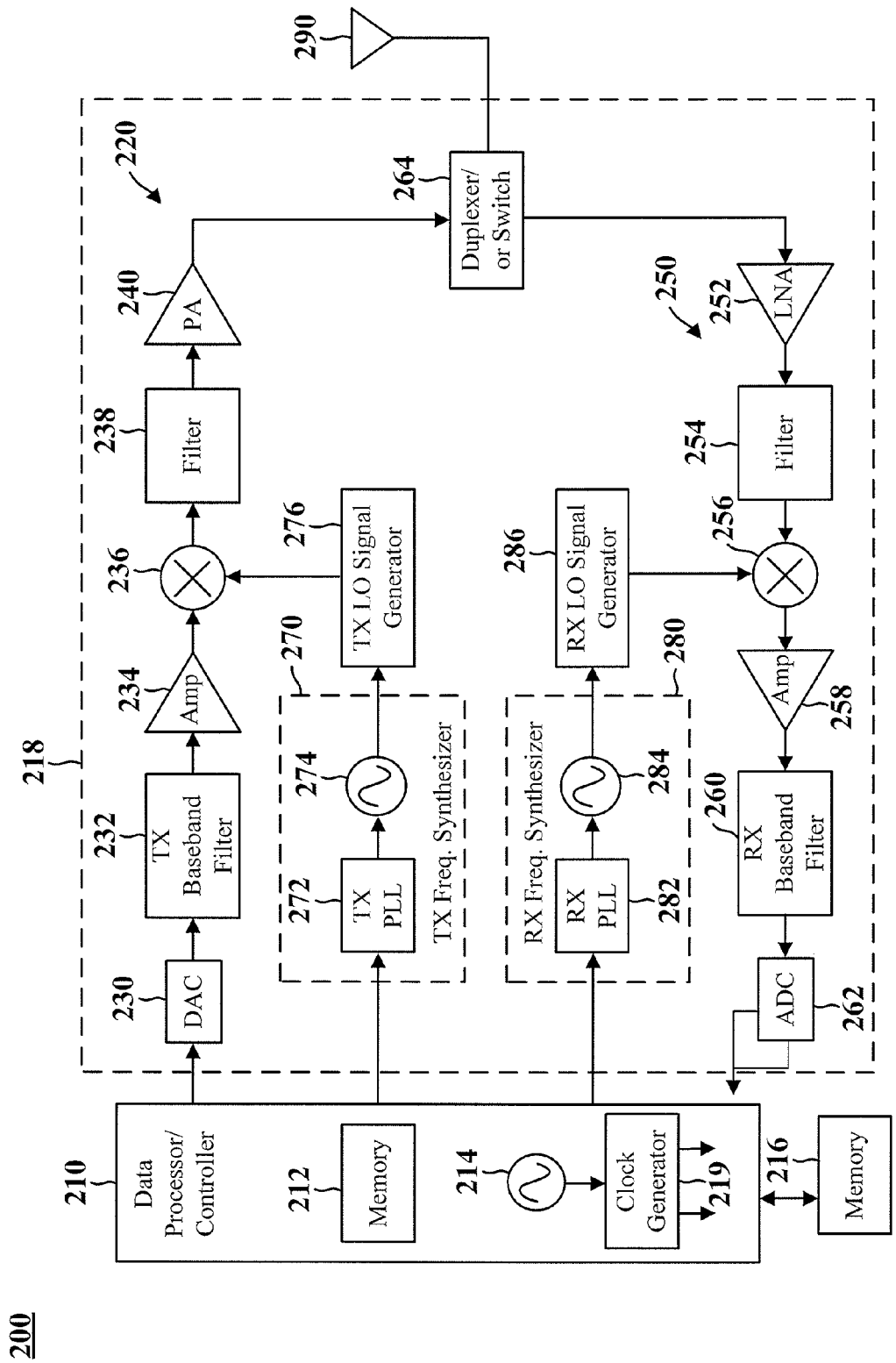
FIG. 2 is a block diagram of a wireless device.

FIG. 2 is a block diagram 200 of an exemplary wireless device, such as the wireless device 110. The wireless device includes a data processor/controller 210, a transceiver 218, and an antenna 290, and may further include memory 216. The transceiver 218 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a DAC 230. The DAC 230 converts a digital input signal to an analog output signal. The analog output signal is provided to a TX baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer/switchplexer 264, which may include a TX filter for the transmitter 220 and a RX filter for the receiver 250. The TX filter may filter the output RF signal to pass signal components in a transmit band and attenuate signal components in a receive band. For TDD, the transmitter 220 and the receiver 250 may be coupled to duplexer/switchplexer 264. The duplexer/switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer/switchplexer 264 may filter the received RF signal to pass signal components in a receive band and attenuate signal components in the transmit band. For TDD, the duplexer/switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 218 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 219 may receive the VCO signal from the oscillator 214 and may generate clock signals for various modules within the data processor/controller 210. The data processor/controller 210 may be implemented on one or more application specific integrated circuits (ASICs) and/or other ICs.

Figure 3:
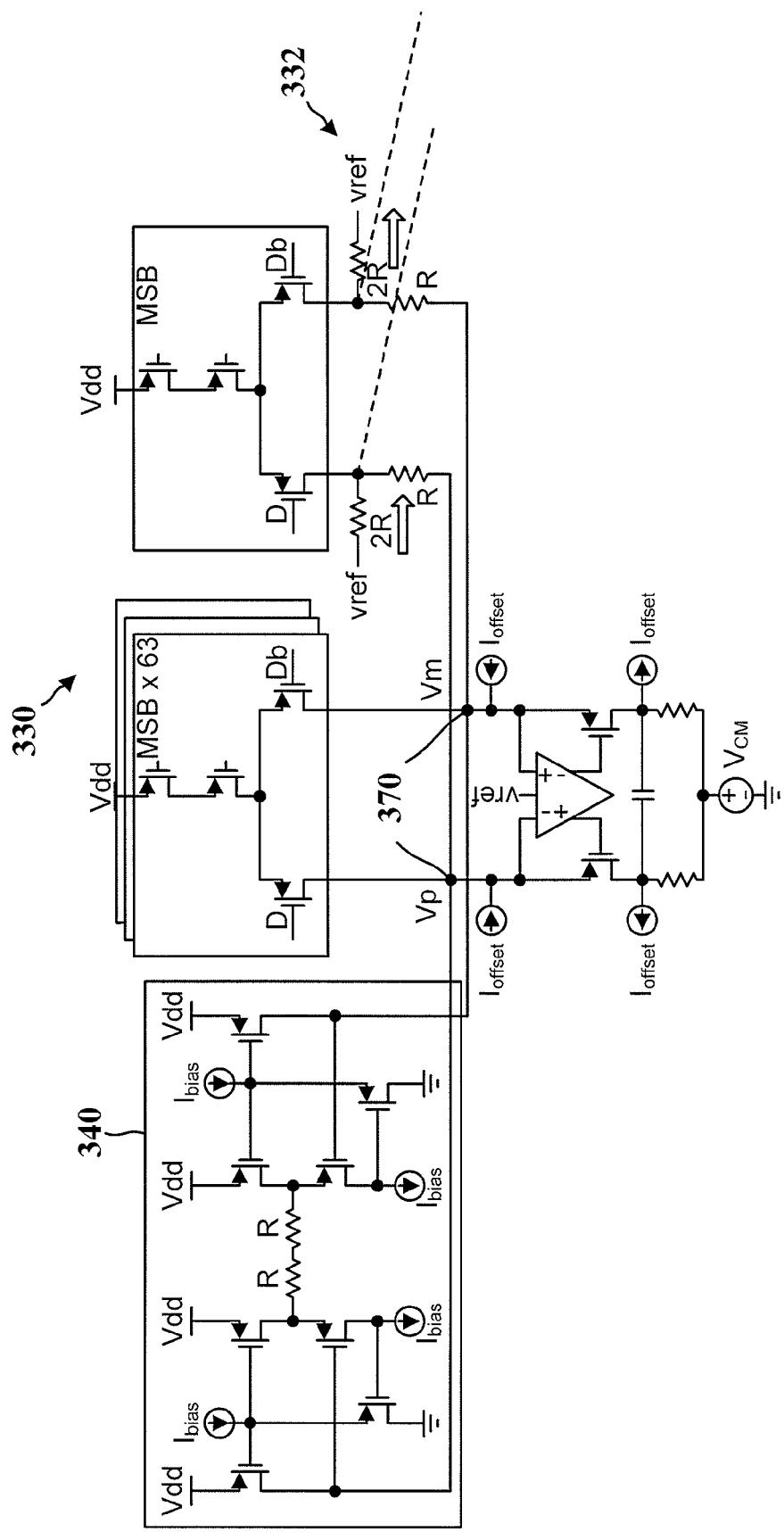
FIG. 3 is a diagram illustrating a negative transconductance ($g_m$) circuit coupled to a DAC.

FIG. 3 is a diagram illustrating a negative transconductance ($g_m$) circuit coupled to a DAC. Referring to FIG. 3, a wireless device (e.g., the wireless device 110 shown in FIG. 1) may include a DAC 330 (e.g., the DAC 230 shown in FIG. 2) for use in signal transmission, such as a transmit digital-to-analog converter (TxDAC).

A type of DAC, known as the 20SOC TxDAC 330, has a particular resistor structure, which may be referred to as an R-2R structure, or an R-2R resistor ladder network. The R-2R structure improves most significant bit (MSB) to least significant bit (LSB) glitch matching (e.g., to improve glitch noise performance, which is generated by asynchronous operation of the various bits of the DAC), and reduces receiver band noise.

Figure 4:
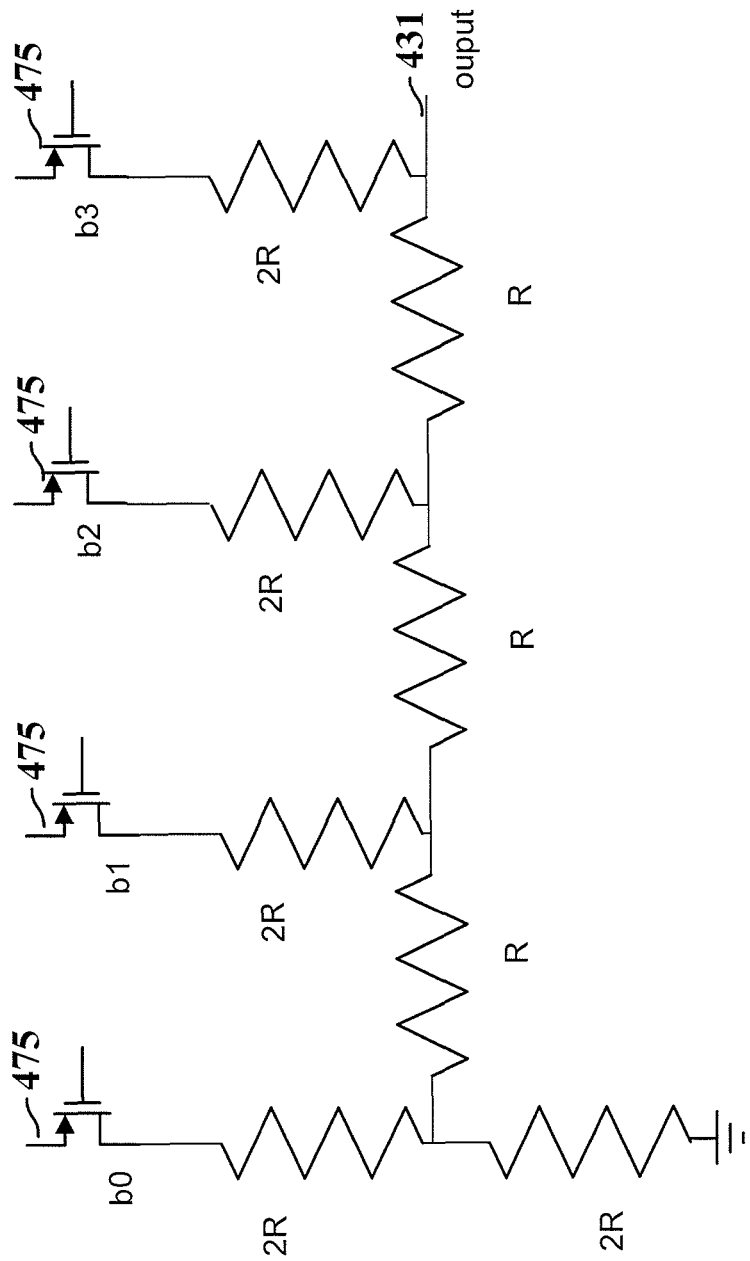
FIG. 4 is a diagram illustrating a 4-bit DAC of an R-2R structure.

FIG. 4 is a diagram illustrating a 4-bit DAC of an R-2R structure. The R-2R resistor ladder network enables the conversion of a parallel digital symbol (e.g., 4-bits b0-b3) into a current or an analog voltage, which may be measured at the output 431. Each of the four digital inputs (b0-b3) adds a respective weighted contribution to the analog output 431, and no two different 4-bit words (from 0000 to 1111) will result in an identical current or voltage at the output 431.

A switch 475 for each of the bits b0-b3 may be operated according to whether a value on a particular one of the bits b0-b3 is 1 or 0. Accordingly, the value of the digital signal into the DAC can be created by operation of switches 475 that control the bits of the DAC. For example, a closed switch 475 for a particular bit may correspond to the bit representing a "1" for the position of the bit within the digital symbol, while an open switch corresponds to the bit representing a "0." Accordingly, if all of the switches for controlling the bits of the DAC are open (e.g., if all four switches of a four-bit DAC are open to produce a digital symbol of 0000), then no current flows into the resistor ladder, and no current or voltage is produced at the output 431.

By extending (or reducing) the R-2R pattern of the resistor ladder shown in FIG. 4, an R-2R resistor ladder network can be scaled to any number of bits. Furthermore, only two different resistor values are used to construct the R-2R structure. For example, if the value of the "R" resistors in FIG. 4 is 3 ohms, then the value of the resistors represented by "2R" is 6 ohms (i.e., twice the value of the resistors represented by "R"). Because only two resistor values are used, the R-2R resistor ladder network may be easily and accurately produced and integrated into a circuit.

Accordingly, by using an R-2R resistor ladder-based DAC (e.g., an "R-2R DAC"), one can produce analog voltages from digital values, wherein the MSB (e.g., b3) contributes a largest percentage of the current or analog voltage to the output, while the LSB (e.g., b0) contributes a smallest percentage of the current or analog voltage to the output.

Referring back to FIG. 3, the output impedance of the R-2R DAC 330 is generally lower when compared to other DACs due to the use of multiple resistors 332 (e.g., poly resistor), thereby causing higher distortion. That is, the lower differential output resistive impedance degrades DAC distortion, because voltage distortion due to the attenuator can flow through a comparatively low-impedance R-2R node. Conversely, higher output resistive impedance decreases voltage distortion.

FIG. 3 also depicts the negative transconductance circuit 340. A transconductance circuit may be used in various electrical circuits, and is able to convert an input voltage into various current outputs by varying the transconductance ($g_m$) of the transconductance circuit. Transconductance ($g_m$), or "transfer conductance," is a property of some electronic components, and is defined as a ratio of current variation at an output of the component to voltage variation at an input of the component. In direct current applications, transconductance may be defined as the change in current out divided by the change in voltage in. The transconductance circuit 340 may have high bandwidth, high output impedance, low distortion, and high common mode rejection.

The transconductance circuit 340 shown in FIG. 3 is a negative transconductance circuit 340, also referred to as a negative transconductance ($g_m$) circuit 340. A negative transconductance circuit may be a critical block in various applications (e.g., wireless communication applications utilizing a filter, or a DAC). The transconductance ($g_m$) circuit 340 provides transconductance ($g_m$) gain (e.g., voltage-to-current gain) across desired input voltage and frequency ranges. The transconductance ($g_m$) circuit 340 may be coupled to the DAC 330 to either cancel or boost the DAC differential output resistive impedance (i.e., the output impedance of the DAC 330). That is, the output boost of the transconductance ($g_m$) circuit 340 may effectively introduce negative impedance.

For example, the negative transconductance circuit 340 may cancel (or add) some of the equivalent resistance at current-summing nodes 370 that is caused by the R-2R structure of the DAC 330, while increasing (or decreasing) the impedance at the current-summing nodes 370, thereby decreasing (or increasing) distortion. That is, the impedance as seen from the current-summing nodes 370 is inversely proportional to the distortion introduced at the current-summing nodes 370. Furthermore, the transconductance ($g_m$) circuit 340 may be controlled to cancel the expected amount of distortion, which is determined based upon the equivalent impedance and resistance of the bits of the DAC 330 as viewed from the current-summing nodes 370.

Figure 5:
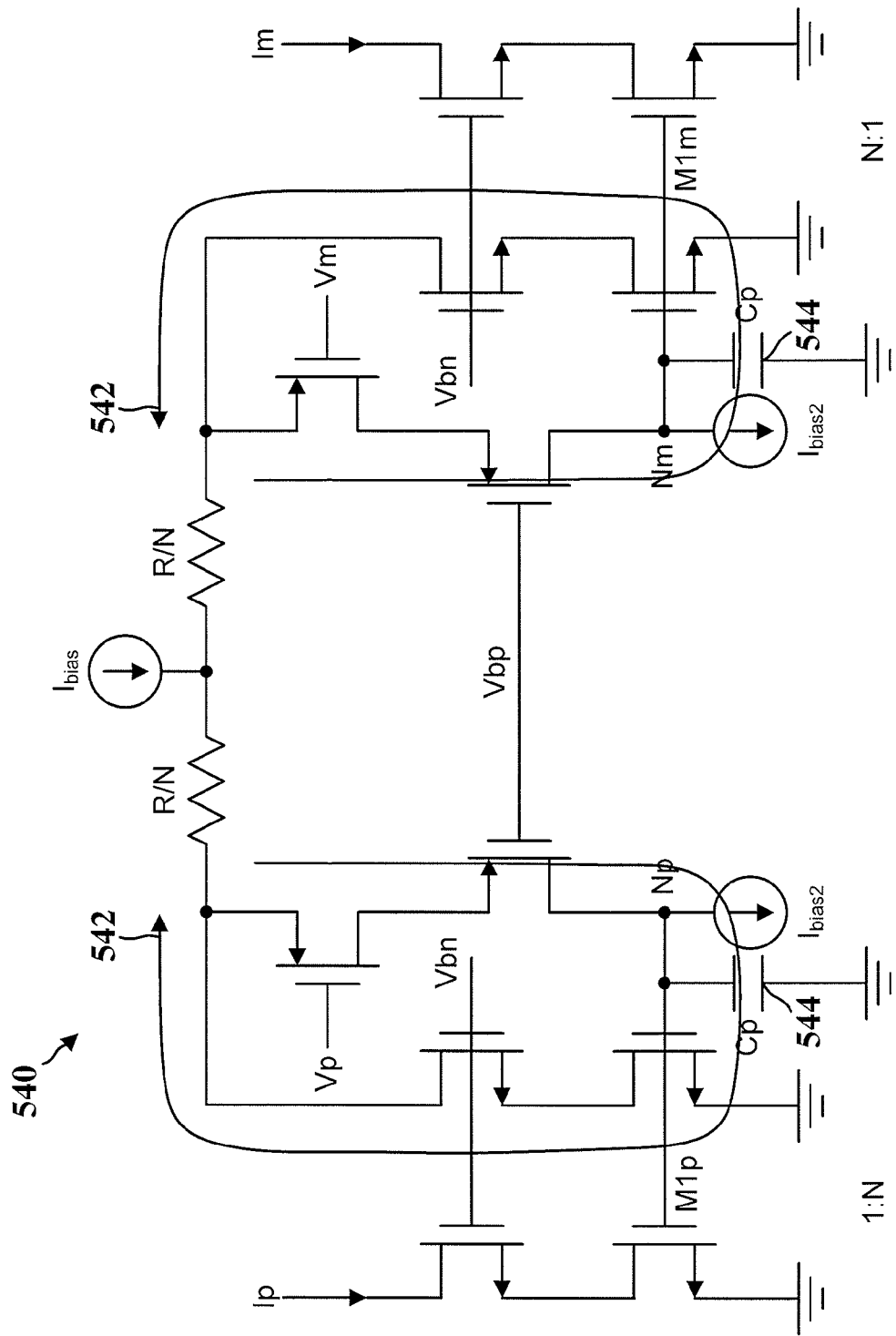
FIG. 5 is a diagram of a transconductance ($g_m$) circuit.

FIG. 5 is a diagram of a transconductance ($g_m$) circuit. A $g_m$ circuit 540 may be analyzed in terms of differential mode and common mode. When the $g_m$ circuit 540 is operating, there is some degree of differential mode feedback, in which the left and right circuit nodes of the $g_m$ circuit 540 loop in opposite directions (as shown in FIG. 5), and there also is some degree of common mode feedback, in which the left and right circuit nodes of the $g_m$ circuit 540 are looped in a common direction. Because the input and output of the DAC 330 is differential, more attention is given toward the analysis of the differential feedback loop GBW of the $g_m$ circuit 540 in the exemplary embodiment.

The differential feedback loop GBW of the $g_m$ circuit 540 is defined as being the bandwidth where the differential loop gain of the $g_m$ circuit 540 drops to one (0 dB). The differential loop gain is relatively large at low frequencies. However, at higher frequencies, there are particular frequencies that are referred to as poles. The lowest frequency pole is referred to as the dominant pole, as this frequency dominates the effect of all of the higher frequency poles. When analyzing the $g_m$ circuit 540 to calculate its gain across various frequencies, the dominant pole is the first frequency where the differential loop starts to drop, and is where the differential loop is impacted most.

The transconductance ($g_m$) circuit 540 may utilize high bandwidth, which may be defined as the transconductance ($g_m$) circuit's 3 dB roll-off frequency, to provide wide band impedance boosting. When the Ip node is electrically connected to the Vp node, and when the Im node is electrically connected to the Vm node, then the transconductance ($g_m$) circuit functions as a negative transconductance ($g_m$) circuit 540, and may therefore introduce negative impedance. The $g_m$ value may be determined by the poly resistor between the differential input pair, which may be sized to be the same as the equivalent differential output resistance of the DAC 330 to provide resistive impedance boosting.

It may also be useful to maintain a flat $g_m$ frequency response with the $g_m$ circuit 540. Thus, because the bandwidth of the $g_m$ circuit 540 is dependent on gain-bandwidth product (GBW), it may be useful for the GBW of the $g_m$ circuit's differential feedback loop 542 to be high. However, routing parasitic capacitance (Cp) at a dominant pole of the $g_m$ circuit 540 (represented by capacitor 544) may significantly degrade the differential feedback loop GBW of the $g_m$ circuit 540.

In electrical circuits, parasitic capacitance is a capacitance that exists between different parts of the electrical circuit due to the proximity of the parts to each other. Routing parasitic capacitance is caused by the capacitance that exists between various wires (i.e., routing or circuit board traces). Parasitic capacitance is caused because capacitance exists between any two proximate conductors. In FIG. 5, the parasitic capacitance (Cp) is equivalently represented by capacitors 544. When looking at the differential loop, the highest impedance and capacitance appears at the node where the parasitic capacitance Cp 544 is represented, thus this node is the dominant pole of the feedback loop. The size of the parasitic capacitance Cp 544 together with its node impedance dictates the dominant pole frequency, and it may be useful to partially negate or cancel the parasitic capacitance Cp 544, as will be described below with reference to FIG. 6.

The GBW of the $g_m$ circuit 540 may be inversely proportional to the parasitic capacitance Cp 544 at nodes Np and Nm, because a value of the parasitic capacitance 544 determines the dominant pole frequency of the differential loop 542. The parasitic capacitance 544 may include gate parasitic capacitance from the apparatus (e.g., Cgs of Mlm and Mlp), and the inherent routing capacitance corresponding to the layout of the apparatus. To extend the bandwidth of the $g_m$ circuit 540, negative capacitance can be intentionally introduced (e.g., at nodes Np and Nm) to reduce or cancel the parasitic capacitance Cp 544.

It may also be desirable for the GBW of the common mode feedback loop to be low for improved common mode stability. Accordingly, exemplary embodiments discussed below provide a $g_m$ circuit that can accommodate large parasitic capacitance, that can provide high differential loop bandwidth, and that can provide low common mode loop bandwidth, thereby providing differential resistive impedance and distortion improvement.

Figure 6:
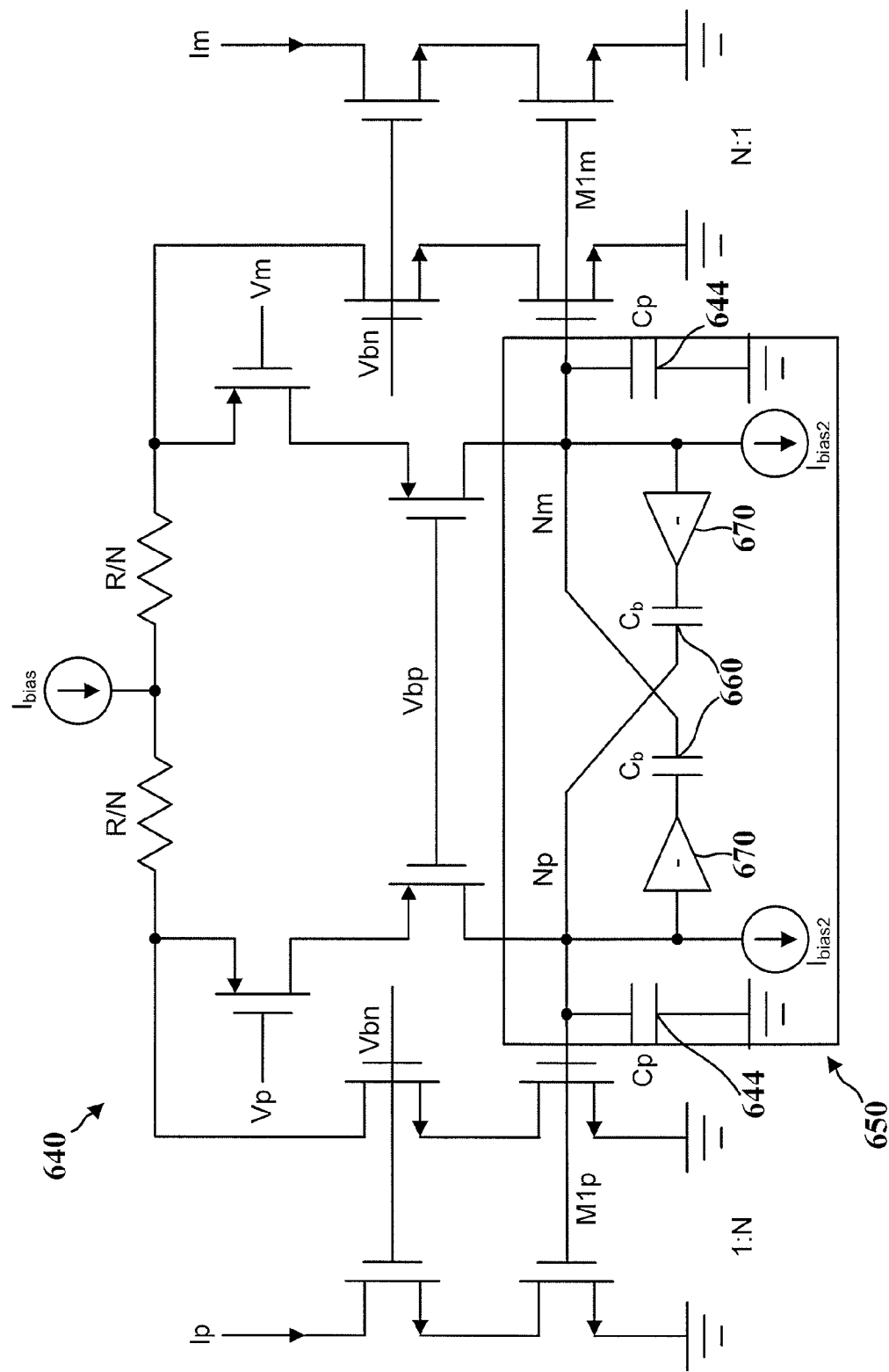
FIG. 6 is a diagram of a transconductance ($g_m$) circuit coupled to a negative capacitance element, according to an exemplary embodiment.

FIG. 6 is a diagram of a transconductance ($g_m$) circuit coupled to a negative capacitance element, according to an exemplary embodiment. Referring to FIG. 6, the exemplary embodiment provides a $g_m$ circuit 640 that can accommodate large parasitic capacitance, and that can provide both high differential loop bandwidth and low common mode loop bandwidth by adding a capacitive element, which may be referred to as a negative capacitance element (NCE) 650. Although the NCE 650 is referred to as a "negative capacitance element," it should be noted that the NCE 650 can be operated to provide negative differential capacitance or positive common mode capacitance, as will be discussed below. The NCE 650 includes a pair of capacitors (Cb) 660, and a pair tunable gain buffers/negative gain buffers 670 having a gain=K, a gain buffer being an analog device that may be used for electrical impedance transformation (e.g., impedance matching) and signal isolation.

The NCE 650 introduces negative differential capacitance at the dominant pole of the $g_m$ circuit 640 to cancel, or at least partially negate, the abovementioned parasitic capacitance Cp 644. Because of what would otherwise be relatively high parasitic capacitance Cp 644 at the dominant pole, the $g_m$ circuit 640 would not otherwise maintain sufficient bandwidth at high frequency if the parasitic capacitance 644 was not partially negated. By reducing the overall parasitic capacitance 644, the $g_m$ circuit 640 has a higher differential GBW and has increased $g_m$ bandwidth (i.e., bandwidth extension). Also, by coupling the NCE 650 to the $g_m$ circuit 640, the $g_m$ circuit 640 effectively acts as a negative $g_m$ circuit 640 to cancel some positive resistance. That is, by adding negative resistance, some of the output impedance of the DAC (e.g., DAC 330) may be canceled or negated.

Furthermore, with respect to the common mode loop of the $g_m$ circuit 640, the NCE 650 also introduces positive common mode capacitance at the dominant pole of the $g_m$ circuit 640. By providing increased capacitance, the NCE 650 provides additional stability to the common mode loop. The NCE 650 may be configured to adjust its capacitance (e.g., to switch between positive and negative capacitance) by tuning the negative gain buffers 670 (e.g., by adjusting the value of gain K).

For example, when the value of gain K of the negative gain buffers 670 is equal to 0, the capacitance of the capacitors Cb 660 is also 0. Accordingly, the NCE 650 will provide no differential mode extension, and no common mode stabilization. As another example, when the value of gain K of the negative gain buffers 670 is tuned to be less than −1, the NCE 650 provides differential mode extension (e.g., increased differential loop bandwidth), as well as common mode stabilization. As yet another example, when the value of gain K of the negative gain buffers 670 is equal to −1, the NCE 650 provides common mode stabilization, but fails to provide differential mode bandwidth extension.

Additionally, by providing the NCE 650 that introduces negative capacitance differentially, the NCE 650 is able to provide a reverse current across nodes Np and Nm while in the differential mode. However, because common mode bandwidth of the $g_m$ circuit 640 is less important than the stability of the common mode loop, the NCE 650 may operate as a positive capacitor during the common mode, and may operate as a negative capacitor during the differential mode. This may be accomplished by tuning the negative gain buffers 670 of the NCE 650, enabling the exemplary embodiment to provide a $g_m$ circuit 640 capable of increased bandwidth and boosted output impedance/DAC impedance, while also being capable of extending and stabilizing the common mode loop (e.g., capable of increasing common mode feedback loop bandwidth).

Figure 7:
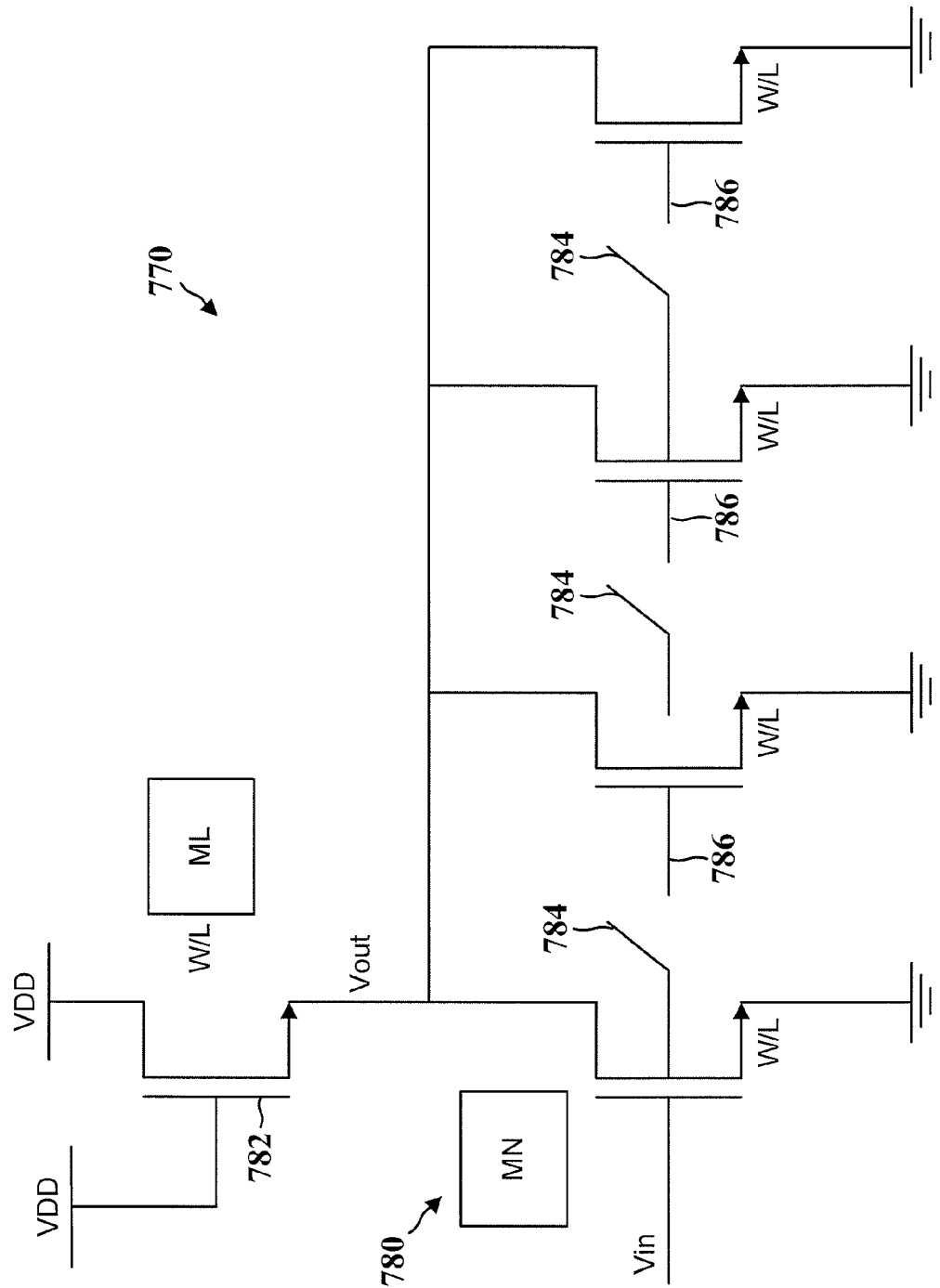
FIG. 7 is a schematic of a negative buffer, according to an exemplary embodiment.

FIG. 7 is a schematic of a negative buffer, according to an exemplary embodiment. Referring to FIG. 7, the negative buffer 770 may include a plurality of transistors 780 coupled in parallel, and an additional transistor 782 coupled in series to the plurality of transistors 780. By individually controlling switches 784 coupled to the gates 786 of the transistors 780, the voltage Vin can be selectively applied to the gates 786 to tune the negative buffer 770, such that the gain value K of the buffer 770 can be changed. As previously mentioned, by changing the gain value K of the buffers 670 of the NCE 650, the characteristics of the $g_m$ circuit 640 may be controlled.

In more detail, because current for ML and MN is the same, $g_{MN}=\sqrt{N}g_{ML}$, where N is the number of NMOS turned on at the bottom (e.g., by closing corresponding switches 784 to provide an on voltage Vin to corresponding gates 786). Therefore, the gain K of this buffer may be defined by $$K = -g_{MN} \times \frac{1}{g_{ML}} = -\sqrt{N}\, g_{ML} \frac{1}{g_{ML}} = -\sqrt{N}.$$

Also, the bias points of MN may be well-defined, because they can be sized/biased the same way as Mlp/Mlm.

Figure 8:
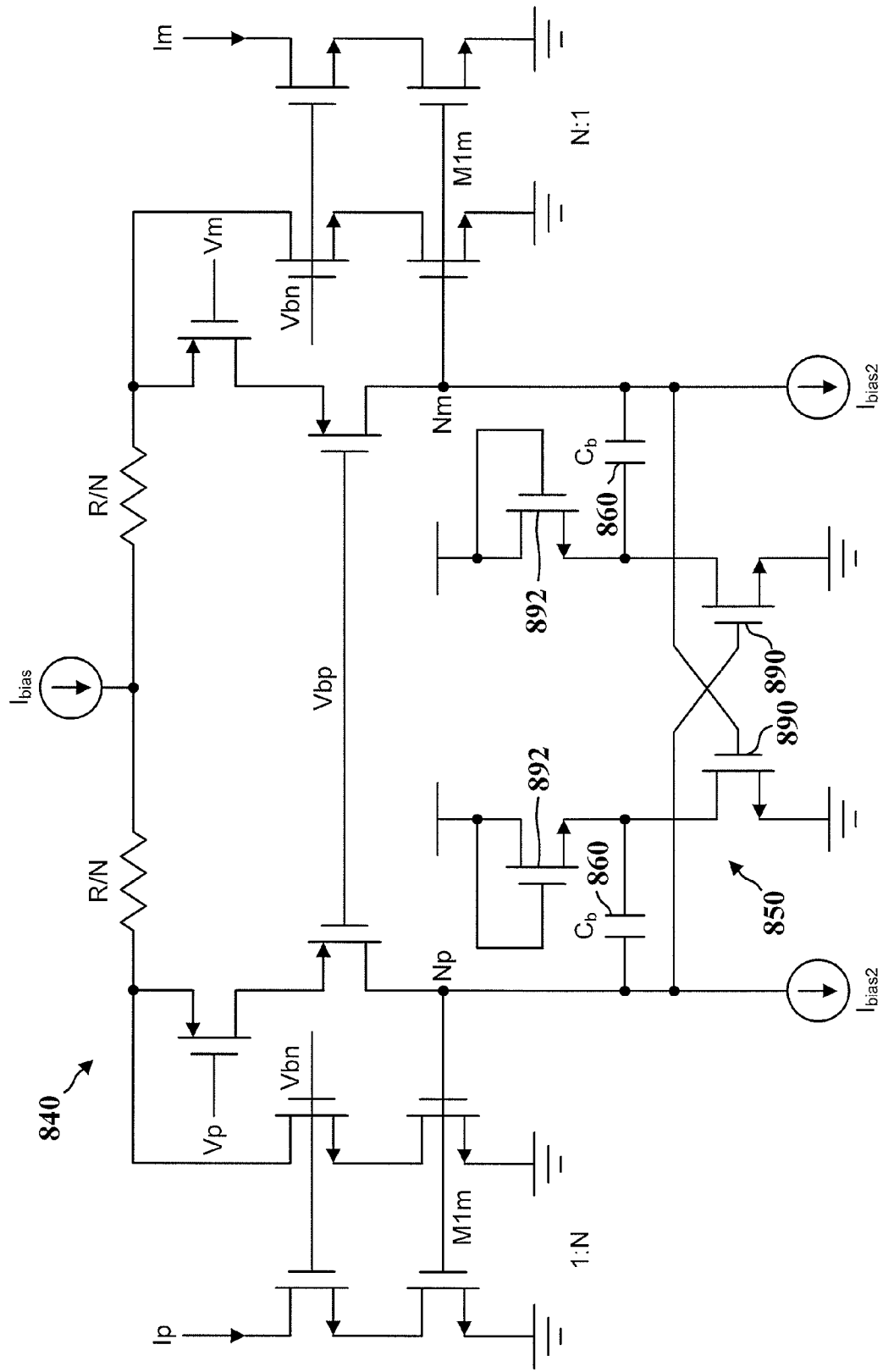
FIG. 8 is a schematic of a transconductance ($g_m$) circuit, according to an exemplary embodiment.

FIG. 8 is a schematic of a transconductance ($g_m$) circuit, according to an exemplary embodiment. Referring to FIG. 8, the NCE 850 of the $g_m$ circuit 840 of another exemplary embodiment includes a pair of cross-coupled/cross-coupling transistors 890, a pair of capacitors Cb 860, and a pair of diode-connected transistors 892. The cross-coupled transistors 890 each include a source electrode coupled to ground, a drain electrode coupled to a respective one of the capacitors Cb 860, and a gate electrode coupled to an opposite respective one of the capacitors Cb 860. The pair of capacitors 860 may include a first electrode coupled to the drain electrode of a respective one of the cross-coupled transistors, and a second electrode coupled to the gate electrode of an opposite respective one of the cross-coupled transistors. The diode-connected transistors 892, each include a source electrode coupled to the drain electrode of a respective one of the cross-coupled transistors 890.

Accordingly, by implementing the NCE of the exemplary embodiments discussed above, the $g_m$ bandwidth of a $g_m$ circuit can be extended. The NCE can also contribute to better distortion performance in, for example, a 20 nm TxDAC, or a 20 SoC TxDAC. When the negative buffer gain K is set to be less than −1, the NCE can both extend the differential loop bandwidth, and can contribute to better phase margin in common mode loop, phase margin being the difference between the phase of an output relative to input, as a function of frequency. When the negative buffer gain K is set equal to −1, the NCE is able to decouple the common mode stabilization and differential loop stabilization. That is, the NCE is able to improve/stabilize the common mode loop by reducing common mode GBW without negatively affecting differential loop bandwidth.

Furthermore, it should be noted that, although the exemplary embodiments provided above discuss utilizing the NCE with a negative $g_m$ circuit, the NCE of the discussed embodiments may be applied to a wide range of $g_m$ circuits or op-amps, within the scope of this disclosure.

Figure 9:
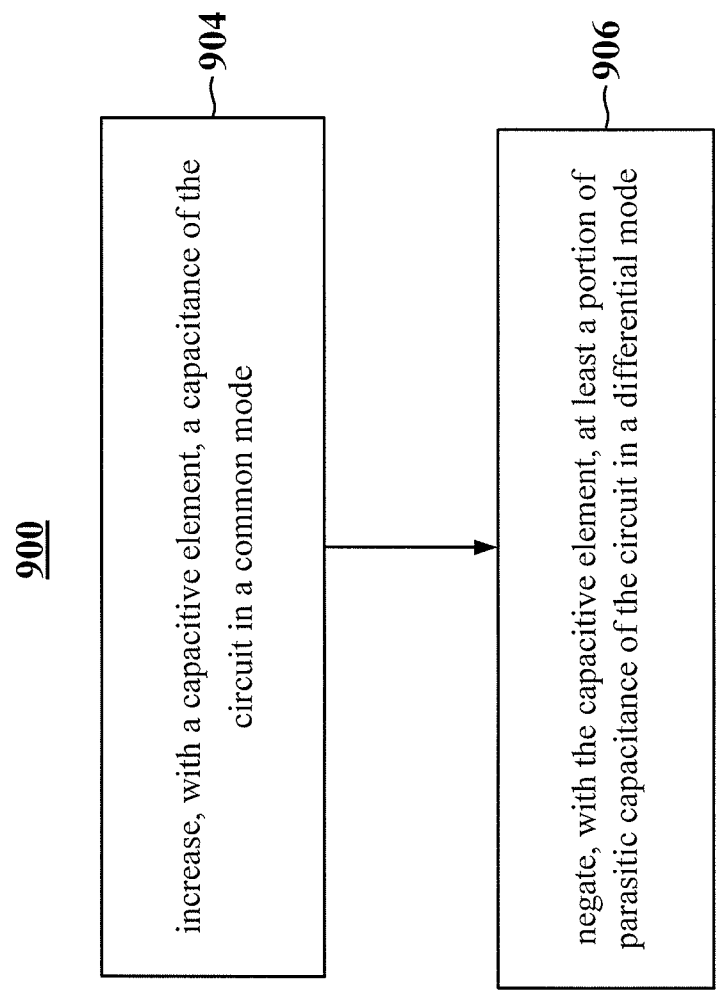
FIG. 9 is a flow chart of a method of decoupling common mode and differential loop bandwidth adjustment of a circuit.

FIG. 9 is a flow chart 900 of a method of decoupling common mode and differential loop bandwidth adjustment of a circuit. The method may be performed by an apparatus, such as one of the above discussed NCEs 650, 850. In one method, the method may include increasing, with a capacitive element, a capacitance of the circuit in a common mode. The capacitive element may include a pair of cross-coupled capacitors configured to be coupled to differential nodes of the circuit, and a pair of negative gain buffers coupled to the capacitors.

In the configuration shown in FIG. 9, at 904, the method may include increasing, with a capacitive element (e.g., NCE 650), a capacitance of the circuit in a common mode. At 906, the method may include negating, with the capacitive element, at least a portion of parasitic capacitance of the circuit in a differential mode.

In another configuration, the method may include adjusting a net capacitance of a circuit with a capacitive element to decouple common mode and differential loop bandwidth adjustment of the circuit. The capacitive element may include a pair of cross-coupled capacitors configured to be coupled to differential nodes of the circuit, and a pair of negative gain buffers coupled to respective capacitors.

In one configuration, the method may further include negating or increasing capacitance of the circuit by tuning the negative gain buffers of the capacitive element. The negating may include tuning one or more of the negative gain buffers to have a gain factor of less than −1. The increasing may include tuning one or more of the negative gain buffers to have a gain factor of less than 0.

In one configuration, each of the negative gain buffers may include a first transistor and a plurality of second transistors. The first transistor may include a source electrode, a drain electrode, and a gate electrode coupled to the drain electrode. The plurality of second transistors may be coupled in parallel, and may each include a drain electrode coupled to the source electrode of the first transistor, a source electrode coupled to ground, and a gate electrode. The negating and the increasing may include tuning the negative gain buffers of the capacitive element by providing a signal to the gate of one or more selected second transistors. The circuit may be a transconductance circuit.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus comprising:
   a capacitive element configured to adjust a net capacitance of a circuit, wherein the capacitive element comprises:
   a pair of cross-coupled capacitors configured to be coupled to differential nodes of the circuit; and
   a pair of negative gain buffers coupled to respective capacitors, wherein the capacitive element is configured to have a positive capacitance to stabilize a common mode feedback loop of the circuit in a common mode.

2. The apparatus of claim 1, wherein the capacitive element is configured to have a negative capacitance to at least partially negate a parasitic capacitance of the circuit in a differential mode, and is configured to extend a differential loop bandwidth of the circuit.

3. The apparatus of claim 2, wherein the parasitic capacitance is at one or more differential nodes of the circuit.

4. The apparatus of claim 1, wherein the capacitive element is configured to be coupled to a transconductance circuit as the circuit.

5. The apparatus of claim 4, wherein the negative gain buffers are tunable.

6. The apparatus of claim 5, wherein a gain factor of each of the negative gain buffers is less than −1 when the circuit is in either differential or common mode.

7. The apparatus of claim 4, wherein each of the negative gain buffers comprises:
   a first transistor comprising a source electrode, a drain electrode, and a gate electrode coupled to the drain electrode; and
   a plurality of second transistors coupled in parallel, each of the second transistors comprising a drain electrode coupled to the source electrode of the first transistor, and a source electrode coupled to ground.

8. A method for decoupling common mode and differential loop bandwidth adjustment of a circuit, the method comprising:
   increasing, with a capacitive element, a capacitance of the circuit in a common mode,
   wherein the capacitive element comprises:
   a pair of cross-coupled capacitors configured to be coupled to differential nodes of the circuit; and
   a pair of negative gain buffers coupled to respective capacitors,
   wherein the capacitive element is increased to a positive capacitance to stabilize a common mode feedback loop of the circuit in a common mode.

9. The method of claim 8, further comprising negating, with the capacitive element, at least a portion of parasitic capacitance of the circuit in a differential mode.

10. The method of claim 9, wherein the negating and the increasing comprise tuning the negative gain buffers of the capacitive element.

11. The method of claim 9, wherein the negating comprises tuning one or more of the negative gain buffers to have a gain factor of less than −1, and
    wherein the increasing comprises tuning one or more of the negative gain buffers to have a gain factor of less than 0.

12. The method of claim 9, wherein each of the negative gain buffers comprises:
    a first transistor comprising:
      a source electrode;
      a drain electrode; and
      a gate electrode coupled to the drain electrode; and
    a plurality of second transistors coupled in parallel, each of the second transistors comprising:
      a drain electrode coupled to the source electrode of the first transistor;
      a source electrode coupled to ground; and
      a gate electrode,
    wherein the negating and the increasing comprise tuning the negative gain buffers of the capacitive element by providing a signal to the gate of one or more selected second transistors.

13. The method of claim 8, wherein the circuit is a transconductance circuit.

14. An apparatus for decoupling common mode and differential loop bandwidth adjustment of a circuit, comprising
    means for adjusting, with a capacitive element, a net capacitance of the circuit, the capacitive element comprising:
    a pair of cross-coupled capacitors configured to be coupled to differential nodes of the circuit; and
    a pair of negative gain buffers coupled to respective capacitors,
    wherein, when the circuit is in a common mode, the means for adjusting are configured to:
    have a positive capacitance to increase the net capacitance, and
    stabilize a common mode feedback loop of the circuit.

15. The apparatus of claim 14, wherein, when the circuit is in a differential mode, the means for adjusting are configured to:
- have a negative capacitance;
- at least partially negate a parasitic capacitance of the circuit to reduce the net capacitance; and
- extend a differential loop bandwidth of the circuit.

16. The apparatus of claim 14, wherein the capacitive element comprises means for adjusting, using the pair of cross-coupled capacitors and the pair of negative gain buffers, a bandwidth or a phase margin of the circuit.

17. The apparatus of claim 16, further comprising means for tuning, in the negative gain buffers, a gain factor of the negative gain buffers.

18. The apparatus of claim 17, wherein the means for tuning the gain factor of each of the negative gain buffers are configured to tune the gain factor to less than 0 when the circuit is in a common mode, and are configured to tune the gain factor to less than −1 when the circuit is in a differential mode.

19. The apparatus of claim 17, wherein each of the negative gain buffers comprises:
- a first transistor comprising:
  - a source electrode;
  - a drain electrode; and
  - a gate electrode coupled to the drain electrode; and
- a plurality of second transistors coupled in parallel, each of the second transistors comprising:
  - a drain electrode coupled to the source electrode of the first transistor; and
  - a source electrode coupled to ground,
- wherein the means for tuning comprise the plurality of second transistors.

20. The apparatus of claim 14, wherein the circuit is a transconductance circuit.

21. An apparatus comprising:
a capacitive element configured to adjust a net capacitance of a circuit, wherein the capacitive element comprises:
- a pair of cross-coupled transistors, each comprising:
  - a source electrode coupled to ground;
  - a drain electrode; and
  - a gate electrode;
- a pair of capacitors, each comprising:
  - a first electrode coupled to the drain electrode of a respective one of the cross-coupled transistors; and
  - a second electrode coupled to the gate electrode of an opposite respective one of the cross-coupled transistors; and
- a pair of diode-connected transistors, each comprising a source electrode coupled to the drain electrode of the respective one of the cross-coupled transistors.

22. An apparatus comprising:
a capacitive element configured to adjust a net capacitance of a circuit, wherein the capacitive element comprises:
a pair of cross-coupled capacitors configured to be coupled to differential nodes of the circuit; and
a pair of negative gain buffers coupled to respective capacitors,
wherein each of the negative gain buffers comprises:
a first transistor comprising a source electrode, a drain electrode, and a gate electrode coupled to the drain electrode; and
a plurality of second transistors coupled in parallel, each of the second transistors comprising a drain electrode coupled to the source electrode of the first transistor, and a source electrode coupled to ground.

* * * * *